US007034367B2

(12) United States Patent
Kobori

(10) Patent No.: US 7,034,367 B2
(45) Date of Patent: Apr. 25, 2006

(54) SEMICONDUCTOR DEVICE HAVING AN STI STRUCTURE AND A DUMMY PATTERN WITH A RECTANGULAR SHAPE

(75) Inventor: Etsuyoshi Kobori, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/781,809

(22) Filed: Feb. 20, 2004

(65) Prior Publication Data

US 2004/0169252 A1 Sep. 2, 2004

(30) Foreign Application Priority Data

Feb. 28, 2003 (JP) ............................ 2003-052844

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................................... 257/374; 257/510

(58) Field of Classification Search ................ 257/374, 257/395, 396, 397, 510, 513
See application file for complete search history.

(56) References Cited

U.S. PATENT DOCUMENTS 5,789,792 A * 8/1998 Tsutsumi .................... 257/506
5,976,949 A 11/1999 Chen

FOREIGN PATENT DOCUMENTS

JP 2001-176959 A 6/2001

* cited by examiner

*Primary Examiner*—Hoai Pham
(74) *Attorney, Agent, or Firm*—McDermott Will & Emery LLP

(57) ABSTRACT

An inventive method for fabricating a semiconductor device includes the steps of: a) forming trenches in an actual element region and a dummy pattern region of a substrate by using a mask; b) depositing an insulator over the substrate, thereby forming an insulating film that fills at least the trenches; and c) removing a portion of the insulating film protruded from the trenches, thereby forming, in the trenches within the actual element region, a first embedded insulating film for isolation, and forming a second embedded insulating film in the trenches within the dummy pattern region. The dummy pattern region has dummy patterns in which no trenches are formed, and the widthwise size of each dummy pattern is four times or less of the depth of a portion of each trench provided in the substrate.

3 Claims, 5 Drawing Sheets

SEMICONDUCTOR DEVICE HAVING AN STI STRUCTURE AND A DUMMY PATTERN WITH A RECTANGULAR SHAPE

BACKGROUND OF THE INVENTION

The present invention relates to a semiconductor device and a method for fabricating the device, and in particular relates to a semiconductor device having an STI structure and a method for fabricating the device.

In recent years, as the packing density of a semiconductor integrated circuit is increased, shallow trench isolation (STI) is adopted as an isolation technique. In this technique, a shallow trench is provided in a substrate, and the trench is filled with an insulating film, thereby forming an isolation region. In the step of forming an STI structure, the insulating film deposited over the substrate is polished by chemical-mechanical polishing (CMP), for example. If the isolation region is large, in the CMP process, there occurs a phenomenon called "dishing" in which the insulating film in the trench is excessively polished; therefore, a method for defining a dummy pattern in an area except an active area is used. As an exemplary method for forming an isolation region as mentioned above, the method disclosed in Japanese Unexamined Patent Publication No. 2001-176959 is known. This method will be described below.

FIGS. 5A and 5B are cross-sectional views illustrating a part of a conventional method for fabricating a semiconductor device having an STI structure, and FIGS. 6A through 6C are cross-sectional views illustrating the conventional method for fabricating the semiconductor device.

First, as shown in FIG. 6A, an underlying oxide film 14 is formed on a semiconductor substrate 12 made of single-crystal silicon or the like, and then a nitride film 15 is formed on the underlying oxide film 14. Subsequently, the nitride film 15 is selectively removed except portions thereof in a device pattern 9 and dummy patterns 11, and thereafter the semiconductor substrate 12 and the underlying oxide film 14 are partially etched using the remaining nitride film 15 as a mask, thereby forming trenches 16. Herein, the "device pattern" refers to the pattern of an active area for forming a semiconductor element such as a MOSFET afterward. Further, the "dummy pattern" refers to the pattern, which is provided in an isolation region other than the active area, for preventing dishing, and includes a dummy active area. If a trench has a large width, the polishing of an insulating film that fills the trench proceeds at a higher rate than that of an insulating film that fills a trench having a narrow width. In this step, by defining the dummy patterns in a region where an insulating film for isolation should be originally formed, the occurrence of dishing can be suppressed in the subsequent CMP process.

Next, an oxide film is deposited over the substrate, thereby forming an HDP (High Density Plasma) oxide film 13 that fills at least the trenches 16. Herein, a portion of the HDP oxide film 13 located over the relatively large isolation region is defined as an "HDP oxide film 13*a*", while a portion of the HDP oxide film 13 located over the minute active area is defined as an "HDP oxide film 13*c*". Thereafter, a resist pattern 17 having a size larger than a predetermined pattern size is defined over the HDP oxide film 13 to etch away a portion of the HDP oxide film 13 formed over the dummy active area. This resist pattern 17 is defined so as to make an opening thereof smaller in size than the active area that is the target for etching, for example.

Then, as shown in FIG. 6B, using the resist pattern 17 as a mask, the etching of the HDP oxide film 13 is carried out to reach the nitride film 15 so that an opening is formed in the HDP oxide film 13. Thus, the HDP oxide film 13*a* is opened at its region located over the relatively large dummy active area, and only portions of the HDP oxide film 13*a* located above ends of the dummy active area remain (hereinafter, these remaining portions will be called "end portions 13*b*"). In this step, in order to allow the nitride film 15 to function as an etch stopper, the width of the opening has to be equal to or larger than a certain width. Therefore, the width of the dummy active area is preferably about 3 μm to about 10 μm, for example.

It should be noted that the HDP oxide film 13*c* formed over the minute device pattern 9 is formed into a small triangular shape as shown in FIG. 6B. For example, in a region where a plurality of the minute device patterns 9 are densely provided such as a memory cell section of a dynamic random-access memory (DRAM), a large number of the HDP oxide films 13*c*, each having a small triangular shape, are densely provided.

Subsequently, as shown in FIG. 6C, a CMP process is performed using, for example, a silica slurry to polish the HDP oxide film 13, thereby removing portions of the HDP oxide film 13 located on the nitride film 15. Thus, the HDP oxide film 13 remains only in the trenches 16, and oxide films 20 for trench isolation are formed.

Then, the nitride film 15 and the underlying oxide film 14 are sequentially removed by wet etching, thereby completing the isolation.

In the conventional semiconductor device fabricating method, the HDP oxide film 13*a* over a portion of the dummy active area having a large width is etched beforehand in the step shown in FIG. 6B. Thus, it is possible to reduce the amount of the HDP oxide film 13 over a dummy pattern region, which is to be polished in the step shown in FIG. 6C. As a result, the time required for the polishing can be reduced.

SUMMARY OF THE INVENTION

However, if the conventional fabricating method is employed, in the step shown in FIG. 6B, thin hornlike protrusions 17*a* might be formed on the upper surface of HDP oxide film 13 as shown in FIG. 5A depending on the etching conditions. These protrusions 17*a* are formed because the end portions 13*b*, for example, are largely cut away. In such a case, if the HDP oxide films 13*a* and 13*c* shown in FIG. 6B are simultaneously removed, the hornlike protrusions 17*a* might be broken, and thus flaws 18 might be caused at the upper surface of the substrate as shown in FIG. 5B. Furthermore, with a higher packing density of the semiconductor device, not only the width of each shallow trench isolation but also a distance between the adjacent shallow trench isolations are reduced; therefore, the HDP oxide film 13*a* is reduced in size, and scratches are easily made in the CMP process.

Consequently, as shown in FIG. 5B, when the upper surface of the substrate is planarized through the CMP process, the protrusions 17*a* and/or portions of the HDP oxide film 13 between the oxide films 20 for isolation are broken to make scratches, so that the broken portions might be rolled over an actual element region, and thus the upper surface of the substrate might be flawed. This flaw causes a defect such as misoperation of a transistor in the resulting semiconductor device.

Therefore, an object of the present invention is to provide a semiconductor device in which the generation of scratches is suppressed while the time required for polishing is shortened, and a method for fabricating the semiconductor device.

An inventive semiconductor device includes: a substrate which has an actual element region including active areas and has a dummy pattern region including dummy patterns, and in which trenches are formed in the actual element region and the dummy pattern region; semiconductor elements provided over the active areas of the substrate; a first embedded insulating film, provided in the trenches within the actual element region, for isolating the semiconductor elements adjacent to each other; and a second embedded insulating film, provided in the trenches within the dummy pattern region, for surrounding the dummy patterns, wherein the widthwise size of each dummy pattern is four times or less of the depth of each trench.

Thus, when an STI structure for the inventive semiconductor device is formed, polish time can be reduced as compared with a conventional method even if reverse etching is not carried out. Therefore, the number of fabrication steps can be decreased, and the time required for the fabrication can be reduced. Accordingly, a reduction in the fabrication cost can be achieved. Further, the generation of scratches and flaws at the substrate is reduced as compared with a conventional semiconductor device.

In one embodiment, each dummy pattern may have a rectangular shape in plan view, a shorter side of the rectangular shape may correspond to the widthwise size of the dummy pattern, and a longer side of the rectangular shape may be greater than the widthwise size of the dummy pattern by three times or more. In such an embodiment, in a CMP process for forming an STI structure, for example, a convex portion of the film to be polished is made less breakable, and therefore, it becomes possible to prevent the generation of scratches and flaws at the upper surface of the substrate. Furthermore, if a stopper film is formed over the substrate when the CMP process is carried out, it is possible to allow the stopper film to carry out a sufficient stopper function.

In another embodiment, the widthwise size of each dummy pattern may be greater than 0 μm, and may be equal to or less than 1.0 μm. In such an embodiment, the polish time in fabricating the inventive semiconductor device can be outstandingly reduced. Moreover, since the planarity of the upper surface of the substrate can be made favorable, the yield can also be improved compared with the conventional semiconductor device.

In still another embodiment, given that regions of the substrate except the active areas are isolation regions, the proportion of the dummy patterns in the isolation regions in plan view may be between or equal to 15% and 80%. Such an embodiment is preferable because the polish time can be reduced without causing variations in height of the polished surface in the CMP process.

An inventive method for fabricating a semiconductor device includes the steps of: a) forming trenches in an actual element region and a dummy pattern region of a substrate, the actual element region including active areas, the dummy pattern region including dummy patterns; b) depositing an insulator over the substrate, thereby forming an insulating film that fills at least the trenches; and c) removing a portion of the insulating film protruded from the trenches, thereby forming, in the trenches within the actual element region, a first embedded insulating film for isolation, and forming, in the trenches within the dummy pattern region, a second embedded insulating film for surrounding the dummy patterns, wherein the widthwise size of each dummy pattern is four times or less of the depth of each trench.

In this method, since the polish time can be reduced as compared with the conventional method even if reverse etching is not carried out, it is possible to omit a lithography process and a reverse etching process. Accordingly, it becomes possible to form an STI structure in a shorter time and at a lower cost than the conventional method.

In one embodiment, each dummy pattern may have a rectangular shape in plan view, a shorter side of the rectangular shape may correspond to the widthwise size of the dummy pattern, and a longer side of the rectangular shape may be greater than the widthwise size of the dummy pattern by three times or more. In such an embodiment, in the case where the step c) is carried out by a CMP process, for example, the strength of the insulating film to be polished is maintained at a predetermined value or more. Therefore, it becomes possible to eliminate the possibility of the breakage of a convex portion of the insulating film and the generation of flaws and scratches, for example, at the polished surface. Besides, if a stopper film is provided over the substrate, it is possible to allow the stopper film to carry out a sufficient stopper function against polishing.

In another embodiment, the widthwise size of each dummy pattern may be greater than 0 μm, and may be equal to or less than 1.0 μm. In such an embodiment, if the step c) is carried out by a CMP process, the polish time can be considerably shorter than that in the conventional method. In addition, since the planarity of the polished surface can also be improved, the yield of the semiconductor device can be improved accordingly.

In still another embodiment, given that regions of the substrate except the active areas are isolation regions, the proportion of the dummy patterns in the isolation regions in plan view is preferably between or equal to 15% and 80%.

In still yet another embodiment, after the step b) has been performed, portions of the insulating film located over the dummy patterns may each have a triangular shape in cross section taken along the shorter side of each dummy pattern. In such an embodiment, since the amount of polishing is small compared with the case where the cross section has a quadrilateral shape, the polish time can be reduced. In particular, if a ceria slurry is used in the polishing, the polish time can be significantly reduced.

In still another embodiment, in the step c), the insulating film may be polished by chemical-mechanical polishing using a ceria slurry. In such an embodiment, not only the polished surface can be precisely planarized but also the polish time can be reduced. As a result, the production efficiency of the semiconductor device can be improved while a decrease in yield of the semiconductor device is suppressed.

DESCRIPTION OF THE PREFERRED EMBODIMENTS

Method for Fabricating Semiconductor Device

FIGS. 1A through 1E are cross-sectional views illustrating a method for fabricating a semiconductor device according to an embodiment of the present invention. As shown in FIGS. 1A through 1E, the present invention is characterized in that when an actual element region and a dummy pattern region are formed on a substrate, a pattern in the dummy pattern region is appropriately set. Described below is the step of forming isolation regions, which is included in the semiconductor device fabricating method of the present embodiment. Herein, the "actual element region" refers to the region that includes: active areas for forming semiconductor elements such as MOSFETs; and actual isolation regions for electrically isolating the semiconductor elements adjacent to each other. On the other hand, the "dummy pattern region" herein refers to the region that includes: dummy active areas which are provided in isolation regions (regions of the substrate which are not the active areas), and in which no trench is formed in the substrate; and dummy isolation regions in which trenches are formed in the substrate. It is to be noted that the actual isolation regions included in the actual element region does not include the dummy pattern region. Besides, "dummy pattern" herein means the dummy active area.

Figure 1A:
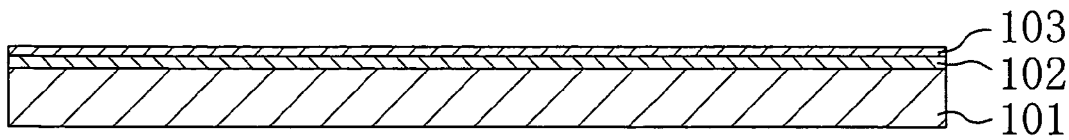
FIGS. 1A through 1E are cross-sectional views illustrating a method for fabricating a semiconductor device according to an embodiment of the present invention.

First, as shown in FIG. 1A, a polysilicon film 102 with a thickness of 10 nm to 30 nm, and an SiN film 103 with a thickness of 80 nm to 120 nm are deposited over a substrate 101 made of a semiconductor such as silicon.

Figure 1B:
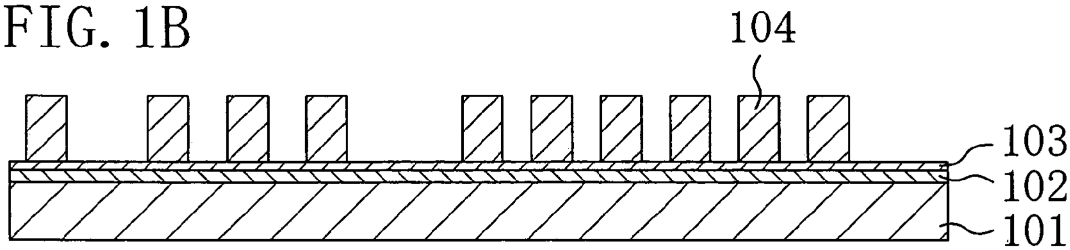

Next, as shown in FIG. 1B, a resist pattern 104 for forming an embedded oxide film is defined over a region where an actual element region 106 and a dummy pattern region 105 are will be formed. In this case, the resist for forming the dummy pattern region 105 has a structure in which a large pattern, used in the conventional method, is divided into small parts. To be more specific, the widthwise size of each small part of the resist for the dummy pattern region 105 is equal to or less than about 1.0 μm.

Figure 1C:
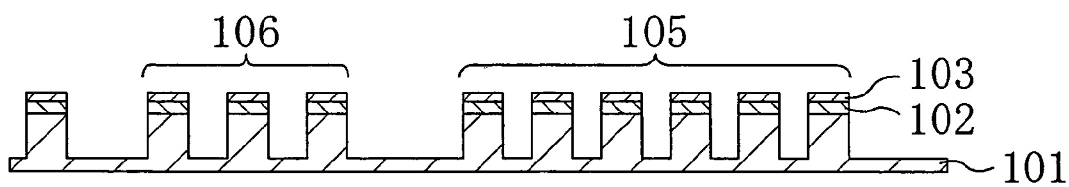

Thereafter, as shown in FIG. 1C, dry etching is performed using the resist pattern 104 as a mask to partially remove the SiN film 103, polysilicon film 102 and substrate 101, thereby forming the actual element region 106 having trenches for isolation, and the dummy pattern region 105. In this case, each trench, provided in the substrate 101 within the actual element region 106 and the dummy pattern region 105, has a width of about 0.2 μM to about 0.7 μm and a depth of about 0.4 μm (including a portion of each trench formed in the polysilicon film 102 and SiN film 103). In this step, the widthwise size of each dummy pattern (dummy active area), i.e., the transverse size thereof in FIG. 1, is 1.0 μm or less, and the dummy pattern region 105 is formed such that the value obtained by the following expression: (Widthwise Size of Dummy Pattern)/(Depth of Trench Formed in Substrate 101) is 4 or less. Herein, the "Depth of Trench Formed in Substrate 101" refers to the depth of each trench except a portion thereof formed in the polysilicon film 102 and SiN film 103.

Further, the longitudinal size of each dummy pattern (i.e., the size of each dummy pattern perpendicular to the transverse size thereof in FIG. 1) is greater than the widthwise size of each dummy pattern by three times or more. Furthermore, the widthwise size of each trench formed in the actual element region 106 is about 0.1 μm to about 0.7 μm, and the widthwise size of each active area is about 0.1 μm to about 1 μm. The proportion of the area of the dummy patterns to that of the isolation regions (regions of the substrate except the active areas), i.e., the proportion of the dummy patterns, is between or equal to 15% to 80%.

Figure 1D:
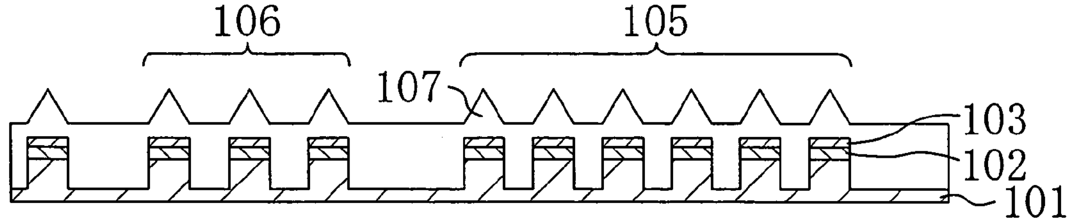

Subsequently, as shown in FIG. 1D, an HDP-CVD process, for example, is employed to deposit an insulating film 107 of $SiO_2$ or the like over the substrate 101, thereby filling the trenches formed in the actual element region 106 and dummy pattern region 105. In this embodiment, in the step shown in FIG. 1C, the shape of the dummy pattern region 105 is controlled in accordance with that of the actual element region 106. Therefore, by only adjusting the conditions for the HDP-CVD process, the thickness of the insulating film 107 deposited over the active areas in the actual element region 106 can be substantially equated with that of the insulting film 107 deposited over the dummy active areas in the dummy pattern region 105. According to the method of the present embodiment, in the step shown in FIG. 1B, the value obtained by the following expression: (Widthwise Size of Dummy Pattern)/(Depth of Trench Formed in Substrate 101) is 4 or less. Therefore, the insulating film 107, deposited over the active areas and dummy active areas, has tapered upper portions, each formed into an approximately triangular shape, in cross section taken along the shorter side of each dummy pattern.

In exemplary conditions for the HDP-CVD process in this step, it is preferable that RF power is 2 kW to 5 kW, Bias power is 1 kW to 3 kW, the supply of $SiH_4$ is set at about 30 mL/min to about 50 mL/min, and the Supply of $O_2$ is set at about 50 mL/min to about 100 mL/min.

Figure 1E:
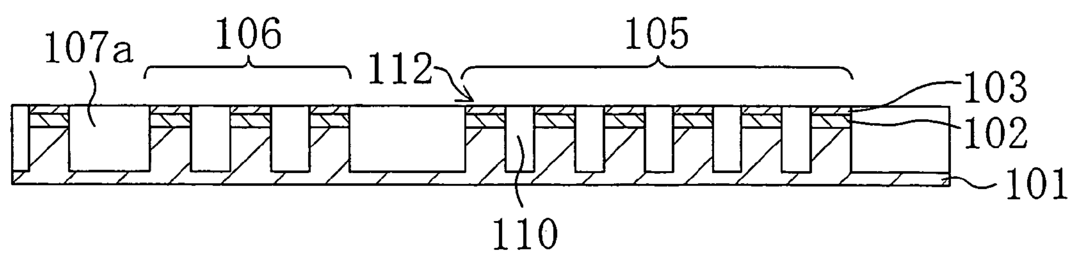

Next, as shown in FIG. 1E, a CMP process is performed using the SiN film 103 as a stopper, thereby removing a portion of the insulating film 107 formed over the active areas and dummy active areas. In this step, in order to precisely planarize the substrate surface after polishing, a ceria slurry is preferably used. Alternatively, a silica slurry or the like may also be used. If a ceria slurry is used, since the insulating film 107 formed over the active areas and dummy active areas has approximately triangular upper portions in cross section taken along the shorter side of each dummy pattern, the polishing with a ceria slurry can be carried out at high speed compared with the case where the cross section of the insulating film 107 is formed into a quadrilateral shape. After this step, the SiN film 103 and polysilicon film 102 are removed, thereby making it possible to form first and second embedded insulating films 107*a* and 110 that fill the trenches formed in the actual element region 106 and dummy pattern region 105, respectively. As a result, an STI structure can be completed.

Structure of Semiconductor Device of Present Embodiment

Figure 2:
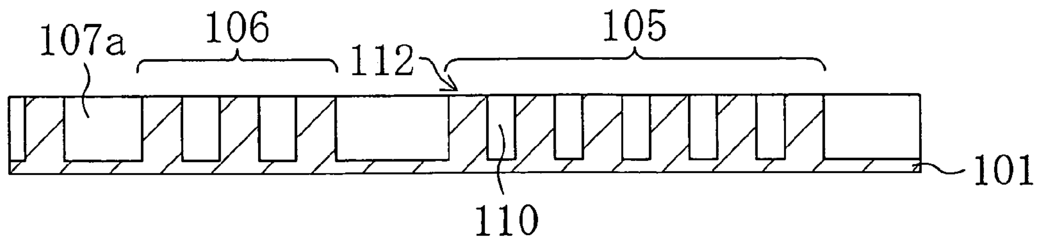
FIG. 2 is a cross-sectional view illustrating the semiconductor device according to the embodiment of the present invention.

FIG. 2 is a cross-sectional view illustrating a semiconductor device of the present embodiment.

As shown in FIG. 2, the semiconductor device of the present embodiment fabricated by the above-described method is formed with: an actual element region 106 including active areas; and a dummy pattern region 105. And the semiconductor device includes: a substrate 101 in which trenches are formed; a plurality of semiconductor elements (not shown) such as MOSFETs provided over the active areas of the substrate 101; a first embedded insulating film 107*a* that fills the trenches in the active element region 106, and that isolates adjacent ones of the plurality of semiconductor elements; and a second embedded insulating film 110 that fills the trenches in the dummy pattern region 105. The dummy pattern region 105 is further provided with dummy active areas (dummy patterns) 112 surrounded by the second embedded insulating film 110. Although the dummy active areas 112 are provided with no operable semiconductor elements, constituent elements such as dummy gate electrodes are provided in some cases. Further, the widthwise size of each dummy pattern (dummy active area 112) is 1.0 μm or less, and the value obtained by the following expression: (Widthwise Size of Dummy Pattern)/(Trench Depth) is 4 or less. Furthermore, the longitudinal size of each dummy pattern (i.e., the size of each dummy pattern perpendicular to the transverse size thereof in FIG. 1) is greater than the widthwise size of each dummy pattern by three times or more. Besides, the proportion of the area of the dummy patterns to that of isolation regions, i.e., the proportion of the dummy patterns, is between or equal to 15% to 80%.

It should be noted that a plurality of the above-described dummy active areas 112 are normally provided over the substrate 101 so as to surround, for example, the actual element region 106.

Effects of Semiconductor Device Fabricating Method of Present Embodiment

Figure 5A:
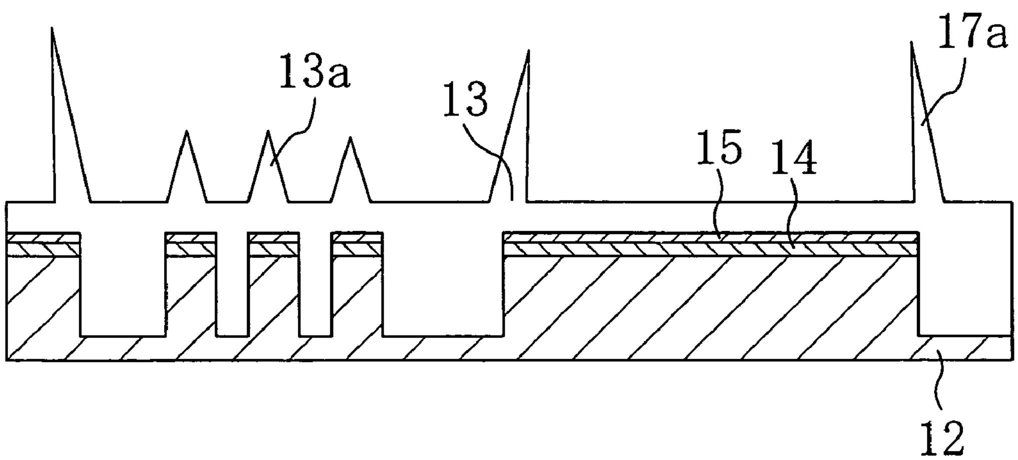
FIGS. 5A and 5B are cross-sectional views illustrating a part of a conventional method for fabricating a semiconductor device having an STI structure.
Figure 5B:
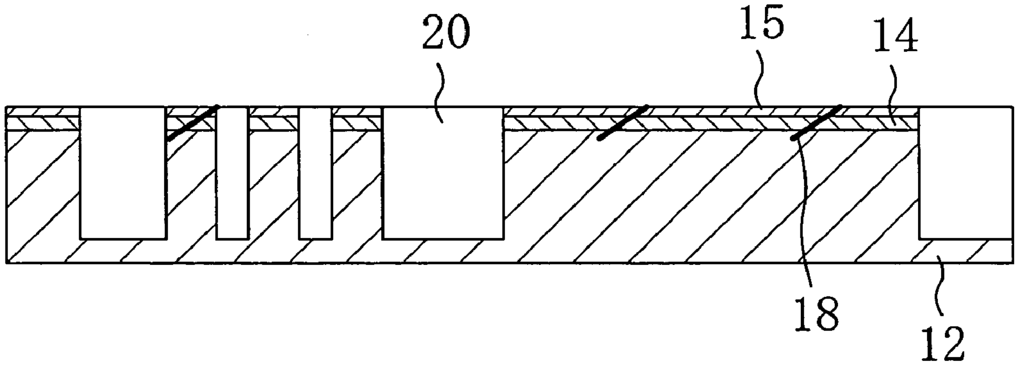
Figure 6A:
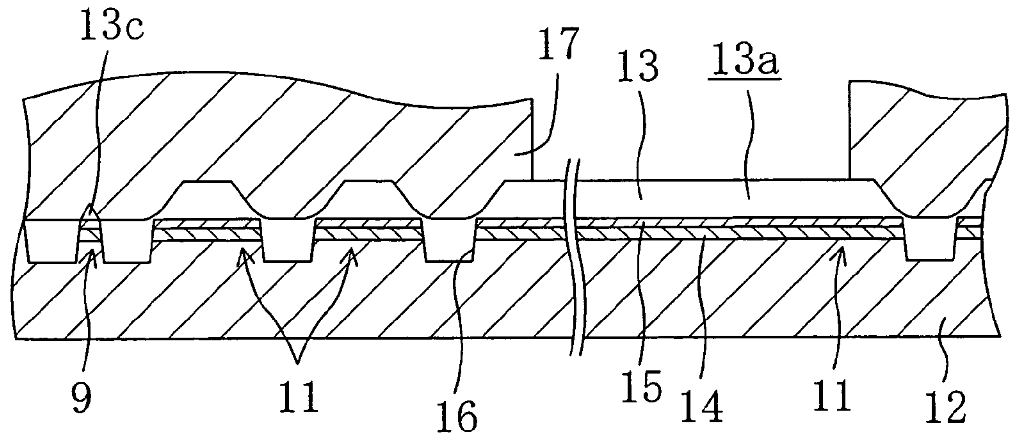
FIGS. 6A through 6C are cross-sectional views illustrating the conventional method for fabricating the semiconductor device.
Figure 6B:
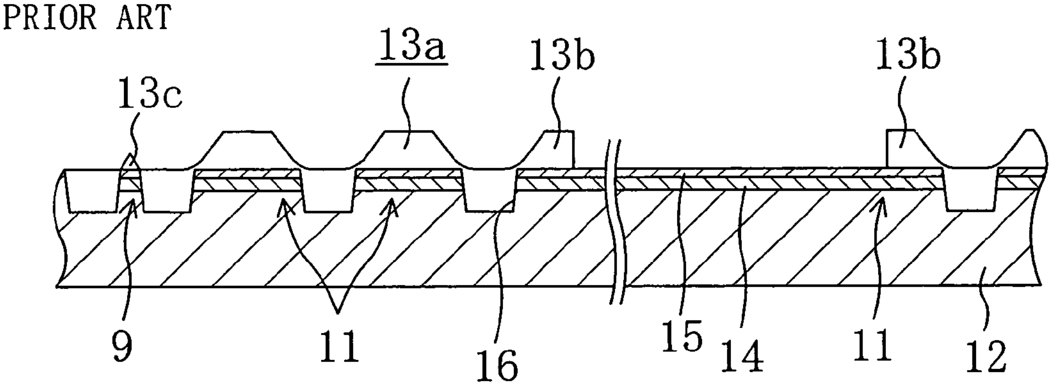
Figure 6C:
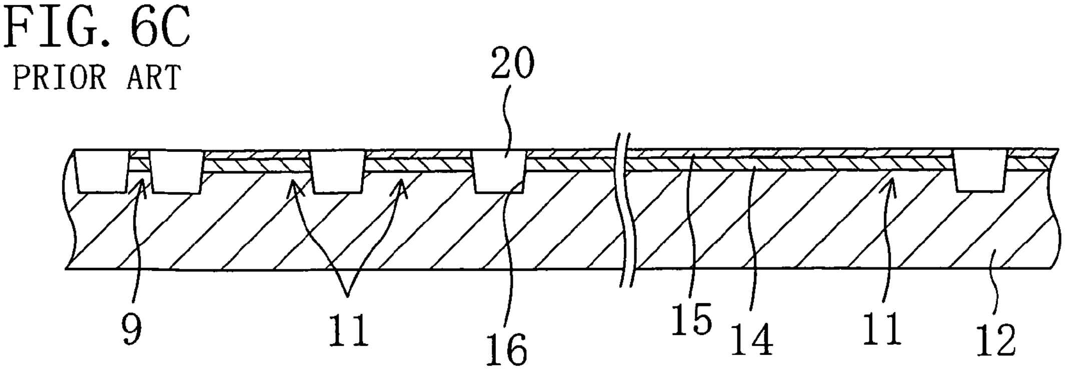

According to the above-described semiconductor device fabricating method of the present embodiment, no reverse etching is carried out after the deposition of the insulating film 107 unlike the conventional method. Therefore, it is possible to prevent the occurrence of flaws and scratches resulting from the breakage of the hornlike protrusions 17*a* (see FIG. 5A).

Further, in the method of the present embodiment, since the value obtained by the following expression: (Widthwise Size of Dummy Pattern)/(Trench Depth) is 4 or less, the polish time can be reduced compared with the conventional method even if reverse etching is not carried out (as used herein, the "polish time" refers to the time required for polishing). Hereinafter, experimental results that constitute grounds for this will be described.

Figure 3A:
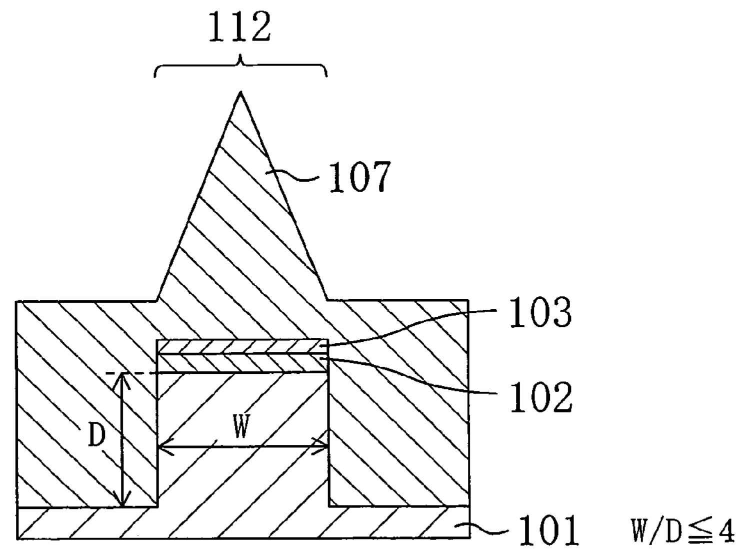
FIG. 3A is a cross-sectional view enlargedly illustrating a trench and a dummy active area within a dummy pattern region in the semiconductor device according to the embodiment of the present invention.
Figure 3B:
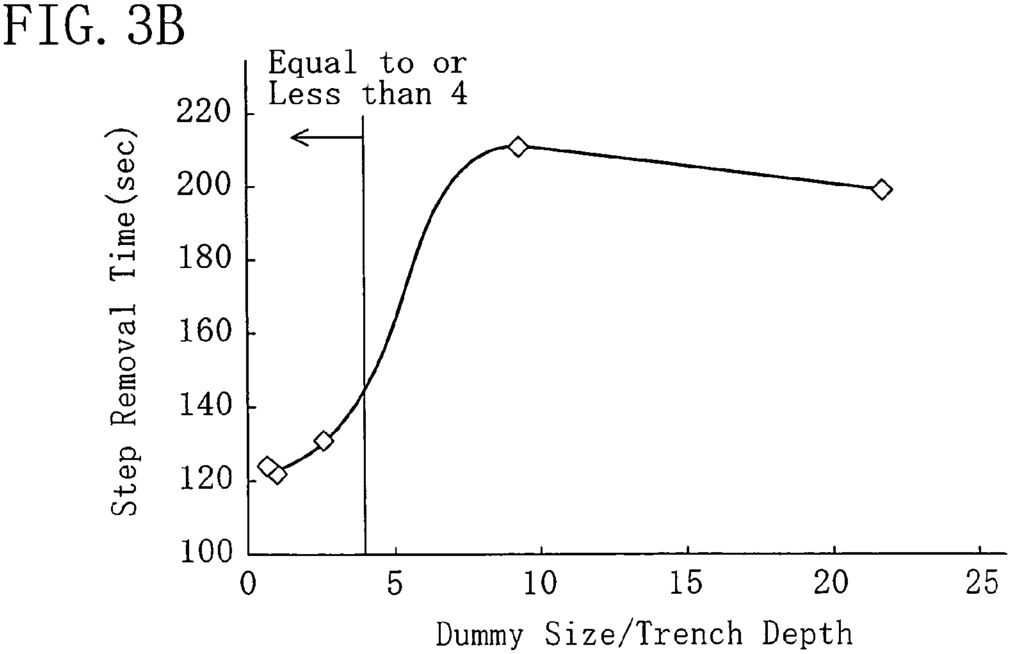
FIG. 3B is a graph showing the relationship between the value obtained by the following expression: (Widthwise Size W of Dummy Pattern)/(Trench Depth D) and the time required for the removal of steps at a substrate surface in a CMP process shown in FIG. 1E.

FIG. 3A is a cross-sectional view enlargedly illustrating the trench and the dummy active region 112 within the dummy pattern region 105 in the semiconductor device of the present embodiment. And FIG. 3B is a graph showing the relationship between the value obtained by the following expression: (Widthwise Size W of Dummy Pattern)/(Trench Depth D) and the time required for the removal of steps at the substrate surface in the CMP process shown in FIG. 1E. It should be noted that in FIG. 3B, "dummy size" means the widthwise size of each dummy pattern. Besides, the time required for removal of steps means the time required for the planarization of the upper surface of the insulating film 107 having steps, and will be hereinafter simply called "step removal time".

From the experimental results shown in FIG. 3B, it can be seen that, if the value obtained by the following expression: (Widthwise Size W of Dummy Pattern)/(Trench Depth D) is 10 or more, the step removal time is 200 seconds or longer. For example, if the conventional dummy pattern including a large dummy active area is used, the step removal time of about 210 seconds is required. On the other hand, it can be seen that, if the value obtained by the following expression: W/D is less than 10, the step removal time is sharply shortened. In particular, it can be understood that, if the value obtained by the following expression: (Widthwise Size W of Dummy Pattern)/(Trench Depth D) is 4 or less, the step removal time is only about 140 seconds or shorter, thus making it possible to sufficiently reduce the polish time.

The polish time is reduced because a portion of the insulating film 107 deposited over the dummy active area 112 is changed in shape, for example. If the value obtained by the following expression: W/D is 4 or less, the insulating film 107 located over the dummy active area 112 has a tapered top portion, which is formed into an approximately triangular shape, in cross section taken along the shorter side of the dummy pattern as shown in FIG. 3A. Therefore, as compared with the case where the cross section is formed into a quadrilateral shape, the amount of the insulating film 107 to be polished is decreased, and thus the polish time is reduced. In particular, although a considerably long period of time is required for the polishing of upper ends of the insulating film 107 if the cross section thereof has a quadrilateral shape, the use of a ceria slurry in the polishing can considerably reduce the polish time since the cross-sectional shape of the insulating film 107 is approximately triangular at its upper portion in this embodiment.

As described above, in the semiconductor device fabricating method of the present embodiment, since the value obtained by the following expression: W/D is 4 or less, the polish time can be reduced as compared with the conventional method. Further, unlike the conventional method, a lithography process and a reverse etching process can be omitted. Therefore, it is possible to considerably reduce the time required for the formation of the STI structure, and in addition, it is possible to prevent the generation of hornlike protrusions at the upper surface of the insulating film 107, which cause flaws and scratches.

Next, the shape, location and effects of the dummy pattern will be described with reference to the associated drawings.

Figure 4A:
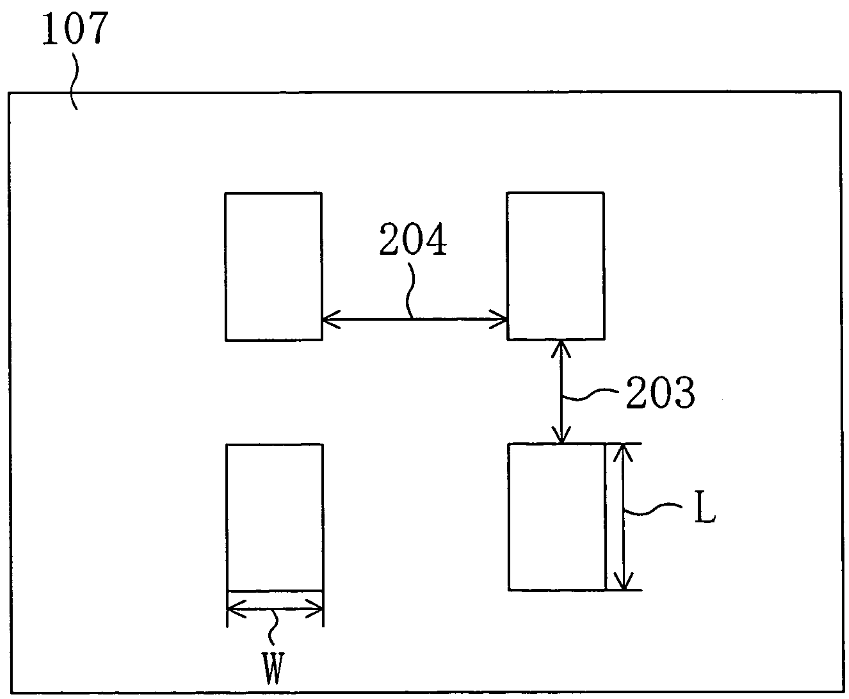
FIG. 4A is a plan view illustrating the upper surface of a part of the dummy pattern region.
Figure 4B:
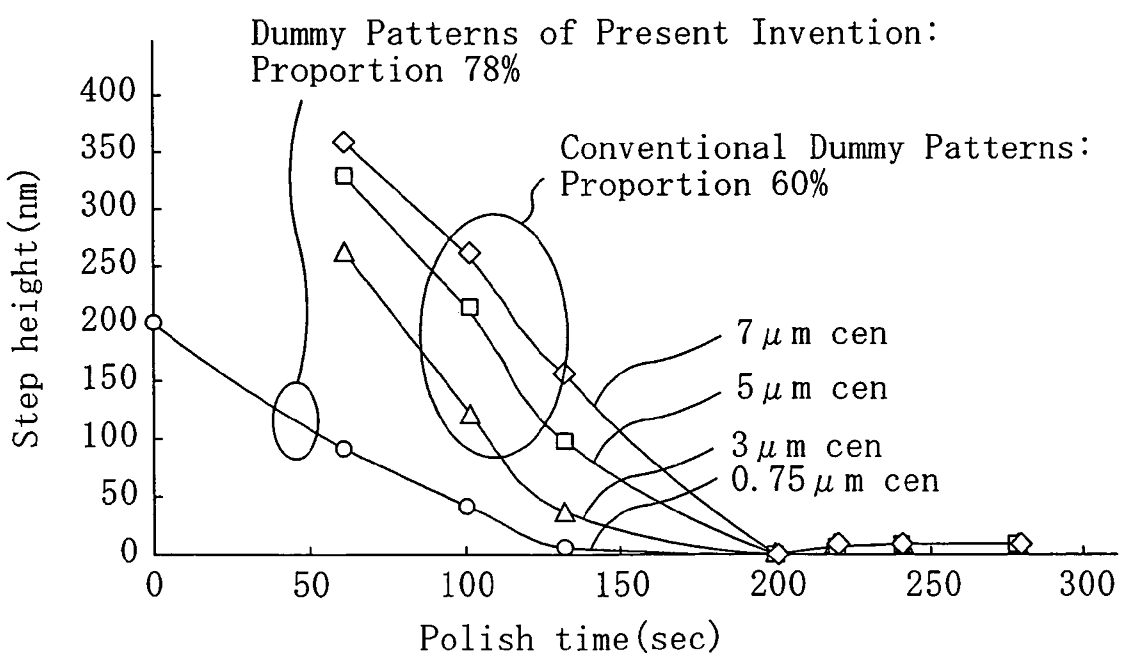
FIG. 4B is a graph showing time-varying changes in height of steps at the polished surface of the semiconductor device according to the embodiment of the present invention and at the polished surface of a conventional semiconductor device.

FIG. 4A is a plan view illustrating the upper surface of a part of the dummy pattern region, and FIG. 4B is a graph showing time-varying changes in height of steps at the polished surface of the semiconductor device of the present embodiment and at the polished surface of a conventional semiconductor device. In FIG. 4A, a transverse distance between the adjacent dummy patterns (dummy active areas) is represented by the reference numeral 204, while a longitudinal distance (a vertical distance in FIG. 4A) between the adjacent dummy patterns is represented by the reference numeral 203. In addition, the widthwise size of each dummy pattern is represented by the reference character W, while the longitudinal size of each dummy pattern is represented by the reference character L.

In the step of polishing the insulating film 107, portions of the insulating film 107 deposited over the active areas in the actual element region 106, and portions of the insulating film 107 deposited over the dummy active areas are protruded from the peripheries of these portions, and therefore, these protruded portions of the insulating film 107 each receive a polishing pressure greater than that applied to the other portions of the insulating film 107. Thus, during polishing of the insulating film 107, the protruded portions thereof might be broken, and lumps each having a certain size might be formed. Such lumps make scratches in the CMP process, and cause flaws at the substrate during planarization of the substrate surface. This phenomenon is conspicuous particularly in the dummy pattern region whose proportion to the substrate surface is larger than the actual element region. To cope with this, the insulating film 107 deposited over the dummy patterns needs to have certain strength.

Therefore, in the semiconductor device fabricating method of the present embodiment, each dummy pattern preferably has a rectangular shape, not a square shape, as view from above. Since each dummy pattern has a rectangular shape in plan view, the resistance of each dummy pattern to forces, applied from respective directions during polishing, is not uniform in a longitudinal direction and a transverse direction; therefore, the film strength during polishing is increased compared with the case where each dummy pattern has the same area and a square shape in plan view. In particular, since the longitudinal size L of each dummy pattern is greater than the widthwise size W of each dummy pattern by three times or more, it is possible to prevent the generation of scratches and flaws at the upper surface of the substrate, and in addition, it is possible to allow the SiN film 103 to carry out a sufficient stopper function during the CMP process. Furthermore, if such a pattern location is realized, the proportion of the dummy patterns can be changed so as to be between or equal to 15% and 80%, for example, in accordance with the pattern location of the actual element region, and therefore, a degree of freedom can be achieved in the layout of the dummy patterns. As a result, even if the pattern location of the actual element region is changed, variations during polishing can be suppressed.

Besides, the adjustment of the widthwise size W of each dummy pattern can improve the planarization characteristics in the CMP process. Hereinafter, this will be described based on the results of the experiment carried out by the present inventors.

FIG. 4B shows the how the step height at the polished surface changes with the polish time in the semiconductor device of the present embodiment in which the widthwise size W of each dummy pattern (along the shorter side thereof) is 0.75 μm, and in the conventional semiconductor device in which the widthwise size of each dummy pattern is changed from 3 μm to 7 μm. In the polishing, a ceria slurry is used. This graph shows the case where the proportion of the total area of the dummy patterns, formed in the semiconductor device of the present embodiment, to the area of the isolation regions, i.e., the proportion of the dummy patterns, is 78%, and the case where the proportion of the dummy patterns, formed by the conventional method, to the isolation regions is 60%. Normally, if the proportion of the dummy patterns is increased, the polish time is prolonged; therefore, it can be seen that the polish time can be considerably reduced if the proportion is less than about 80%.

From these experimental results, it can be understood that even if the proportion of the dummy patterns to the isolation regions is as high as 78% like the dummy patterns of the present embodiment, the total time required for polishing can be shorter than that required for polishing in the conventional method so long as the widthwise size W of each dummy pattern is 1.0 μm or less, e.g., as low as 0.75 μm or 200 nm or less. To the contrary, it can be seen that, in the conventional dummy patterns, the polish time for achieving the same step height (e.g., 250 nm) is prolonged as the widthwise size of each dummy pattern is increased to 3 μm, 5 μm and 7 μm.

From the above results, it can be understood that the widthwise size W of each dummy pattern is preferably 1.0 μm or less. If the widthwise size W of each dummy pattern is 1 μm or less, the polish time is shortened, and thus the occurrence of dishing can be reduced. Moreover, since a difference between the width of each active area and that of each dummy pattern can be reduced as compared with the conventional semiconductor device, the thickness of a portion of the insulating film 107 located over the active areas becomes substantially equal to that of a portion of the insulating film 107 located over the dummy patters in the step shown in FIG. 1D. Therefore, variations in thickness of the SiN film 103 after the polishing can be suppressed, and thus the planarization of the upper surface of the substrate can be further improved.

As described above, according to the semiconductor device fabricating method of the present embodiment, it is possible to suppress variations in thickness of the insulating film deposited over the actual element region and the dummy pattern region, and in addition, it is possible to form the dummy patterns suitable for polishing; thus, the generation of scratches can be suppressed. Furthermore, since the amount of the insulating film deposited over the dummy patterns can be suppressed, the polish time for the deposited insulating film 107 can be reduced. Therefore, according to the semiconductor device fabricating method of the present embodiment, the production efficiency of the semiconductor device can be improved while a decrease in yield is suppressed.

Semiconductor elements provided in the actual element region of the semiconductor device of the present embodiment are not limited to MOSFETs. Alternatively, the actual element region of the semiconductor device of the present embodiment may be provided with a variety of semiconductor elements such as various transistors and/or diodes.

What is claimed is:

1. A semiconductor device comprising:

a substrate which has an actual element region including active areas and has a dummy pattern region including dummy patterns, and in which trenches are formed in the actual element region and the dummy pattern region;

semiconductor elements provided over the active areas of the substrate;

a first embedded insulating film, provided in the trenches within the actual element region, for isolating the semiconductor elements adjacent to each other; and a second embedded insulating film, provided in the trenches within the dummy pattern region, for surrounding the dummy patterns, wherein the widthwise size of each dummy pattern is four times the depth of each trench or less, wherein each dummy pattern has a rectangular shape in plan view, wherein a shorter side of the rectangular shape corresponds to the widthwise size of the dummy pattern, and wherein a longer side of the rectangular shape is greater than the widthwise size of the dummy pattern by three times or more.

2. The semiconductor device of claim 1, wherein the widthwise size of each dummy pattern is greater than 0 μm, and is equal to or less than 1.0 μm.

3. The semiconductor device of claim 1, wherein given that regions of the substrate except the active areas are isolation regions, the proportion of the dummy patterns to the isolation regions in plan view is 15% or more and 80% or less.

* * * * *